United States Patent
Ishizuka et al.

(10) Patent No.: US 8,664,118 B2
(45) Date of Patent: Mar. 4, 2014

(54) SEMICONDUCTOR DEVICE AND METHOD FOR MANUFACTURING THE SAME

(75) Inventors: Akihiro Ishizuka, Sagamihara (JP); Kazuya Hanaoka, Fujisawa (JP); Shinya Sasagawa, Chigasaki (JP); Sho Nagamatsu, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 37 days.

(21) Appl. No.: 13/539,907

(22) Filed: Jul. 2, 2012

(65) Prior Publication Data

US 2013/0011961 A1 Jan. 10, 2013

(30) Foreign Application Priority Data

Jul. 8, 2011 (JP) ................. 2011-152001

(51) Int. Cl.
*H01L 21/302* (2006.01)

(52) U.S. Cl.
USPC .......................... 438/692; 438/778

(58) Field of Classification Search
USPC .......... 438/149, 479, 690, 691, 778, 787, 692
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Kevin M Picardat
(74) *Attorney, Agent, or Firm* — Eric J. Robinson; Robinson Intellectual Property Law Office, P.C.

(57) ABSTRACT

An object is to provide a semiconductor device having excellent characteristics, in which a channel layer includes an oxide semiconductor with high crystallinity. In addition, a semiconductor device including a base film with improved planarity is provided. CMP treatment is performed on the base film of the transistor and plasma treatment is performed thereon after the CMP treatment, whereby the base film can have a center line average roughness $Ra_{75}$ of less than 0.1 nm. The oxide semiconductor layer with high crystallinity is formed over the base film having planarity, which is obtained by the combination of the plasma treatment and the CMP treatment, thereby improving the characteristics of the semiconductor device.

17 Claims, 9 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0017692 A1* | 1/2003 | Noguchi et al. | 438/622 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0032472 A1* | 2/2008 | Yu et al. | 438/250 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0156022 A1 | 6/2011 | Yamazaki et al. | |
| 2011/0215317 A1 | 9/2011 | Yamazaki et al. | |
| 2011/0215326 A1 | 9/2011 | Godo et al. | |
| 2011/0220891 A1 | 9/2011 | Fujii et al. | |
| 2011/0250724 A1 | 10/2011 | Suzawa et al. | |
| 2012/0074407 A1 | 3/2012 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1737-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) SGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTS,", IDW '09 : Proceedings of the 16th International Display Workshops, 2009, pp. 689-692.
Park.J et al., "Amophous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZNO TFT,", IMID '07 Digest, 2007, pp. 1249-1252.
Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godol.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.
OHara.H et al., "21.3:4.0 In. GVGA AMOLED Display Using In—Ga—Zn-Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "SPINEL,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, OR Al; B: Mg, Mn, Fe, Nl, Cu,OR Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor film and a method for manufacturing the semiconductor device.

Note that the semiconductor device in this specification refers to all devices that can function by utilizing semiconductor characteristics, and electro-optic devices, semiconductor circuits, and electronic appliances are all semiconductor devices.

2. Description of the Related Art

In recent years, a market for mobile communications typified by mobile phones and the like has grown rapidly. To meet increasing requirements such as low power consumption, high integration degree, many functions, and high speed in semiconductor integration circuits that are mounted components, improvements in transistor characteristics are needed.

As one of indexes denoting transistor characteristics, an S-value is given. An S-value represents the amount of a change in gate voltage which is needed for changing a drain current by one digit under constant drain voltage. As the S-value becomes smaller, the controllability of the drain current is increased. Under the present circumstances, it is difficult to make the S-value less than or equal to 80 mV/dec because of miniaturization of transistors and the like.

Attention has also been drawn to a technique by which a transistor is manufactured using an amorphous oxide semiconductor material instead of a silicon-based semiconductor material and is applied to an electronic device or the like. For example, a technique for manufacturing a transistor whose channel layer is formed using an amorphous oxide semiconductor material containing indium (In), gallium (Ga), and zinc (Zn) and having an electron carrier concentration lower than $10^{18}/cm^3$ is disclosed (see Patent Document 1).

REFERENCE

[Patent Document 1] Japanese Published Patent Application No. 2006-165529

SUMMARY OF THE INVENTION

In order to improve characteristics of a transistor, it is important to improve the crystallinity of an oxide semiconductor layer and interface characteristics between a base film and the oxide semiconductor layer. As an index denoting the planarity of the base film, the center line average roughness $Ra_{75}$ can be given. A large center line average roughness $Ra_{75}$ of the base film interrupts the crystallization of the oxide semiconductor layer formed over the base film, which leads to a reduction in the crystallinity of the oxide semiconductor layer. As a result, the electric characteristics of the transistor are impaired and the reliability thereof is reduced.

In view of the foregoing problems, an object of one embodiment of the present invention is to provide a semiconductor device having excellent characteristics, in which a channel layer includes an oxide semiconductor with high crystallinity.

In addition, an object of one embodiment of the present invention is to provide a semiconductor device including a base film whose planarity is improved.

To achieve an improvement in characteristics of a semiconductor device, an oxide semiconductor layer with high crystallinity is formed over a base film whose center line average roughness $Ra_{75}$ is reduced.

One embodiment of the present invention disclosed in this specification is a method for manufacturing a semiconductor device, comprising the steps of forming a base film over a substrate, performing CMP treatment on the base film, performing plasma treatment on the base film after the CMP treatment, and forming an oxide semiconductor layer over a planar surface which is obtained by the plasma treatment and the CMP treatment.

In the above method for manufacturing a semiconductor device, the plasma treatment is plasma treatment using a rare gas.

One embodiment of the present invention disclosed in this specification is a method for manufacturing a semiconductor device, comprising the steps of forming a base film over a substrate, performing first plasma treatment on the base film, performing CMP treatment on the base film after the first plasma treatment, performing second plasma treatment on the base film after the CMP treatment, and forming an oxide semiconductor layer over a planar surface which is obtained by the first plasma treatment, the CMP treatment, and the second plasma treatment.

In the above method for manufacturing a semiconductor device, the first plasma treatment and the second plasma treatment are each plasma treatment using a rare gas.

In the above method for manufacturing a semiconductor device, the base film is any of a silicon oxide film, a gallium oxide film, a hafnium oxide film, and an aluminum oxide film.

In the above method for manufacturing a semiconductor device, the substrate may be a semiconductor substrate.

In the above method for manufacturing a semiconductor device, the substrate may be a glass substrate.

In the above method for manufacturing a semiconductor device, the plasma treatment is preferably performed with an ICP etching apparatus which can generate higher-density plasma than a parallel plate plasma device.

When plasma treatment and CMP treatment are performed in combination, a base film can have a center line average roughness $Ra_{75}$ of less than 0.1 nm, so that the S-value of a semiconductor device can be improved.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, according to the following procedure, a base film over a single crystal silicon substrate is subjected to planarization treatment and a transistor including an oxide semiconductor layer is manufactured thereover. A relation between the planarity of the base film and transistor characteristics, in particular, the S value is described. Note that FIGS. 1A to 1F are cross-sectional views of manufacturing steps of the transistor, and FIG. 2 is a top view of the resulting transistor.

Further, transistor characteristics of a transistor including a base film which is not subjected to planarization treatment are measured for comparison.

Figure 1A:
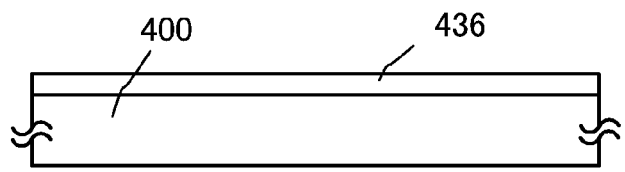
FIGS. 1A to 1F are cross-sectional views of a transistor of one embodiment of the present invention.
Figure 2:
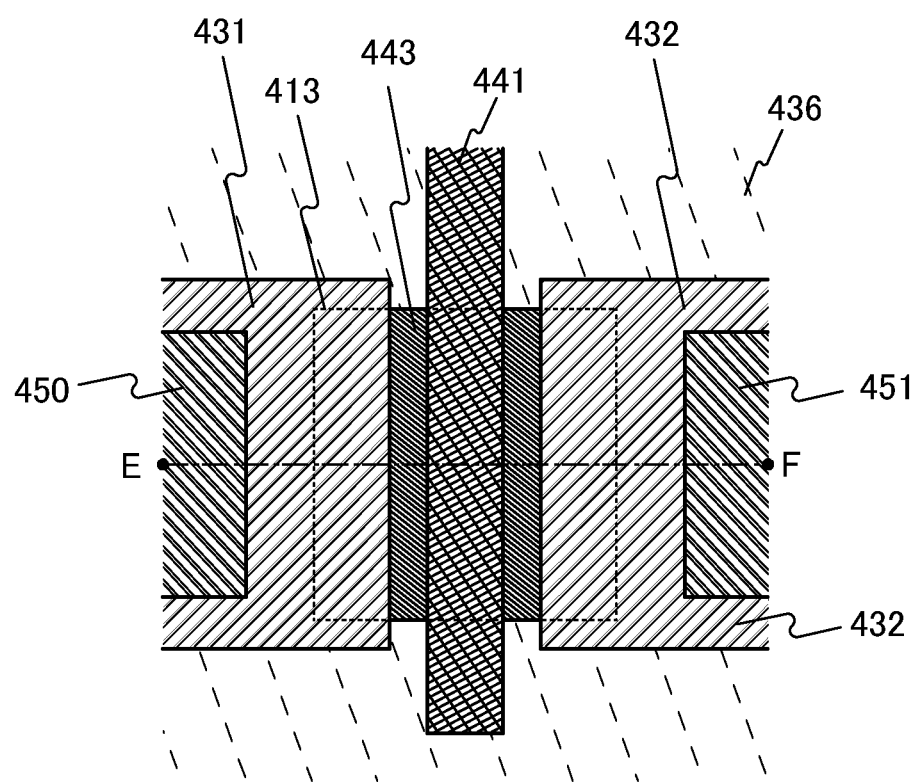
FIG. 2 is a top view of a transistor of one embodiment of the present invention.

First, as illustrated in FIG. 1A, a base film 436 with a thickness of 300 nm is formed over a substrate 400 formed of single crystal silicon. Before the deposition of the base film 436, reverse sputtering in which plasma is generated by introduction of an argon gas is performed for three minutes. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

The base film 436 can be formed with a signal layer or a stack of layers using any of a silicon oxide layer ($SiO_x$($x>2$)), a silicon oxynitride layer, a silicon nitride oxide layer, a gallium oxide layer, a hafnium oxide layer, an aluminum oxide layer, a hafnium silicate layer, a hafnium silicate oxynitride layer, and a hafnium aluminate layer.

In this embodiment, a silicon oxide layer is formed by a sputtering method.

Next, an exposed surface of the base film 436 is subjected to planarization treatment by performing chemical mechanical polishing (CMP) treatment on the surface of the base film 436 and performing plasma treatment using a rare gas such as Kr, Xe, or Ar after the CMP treatment. Conditions of the CMP treatment are as follows: a hard polyurethane pad is used as a polishing pad for CMP; NP8020 (produced by Nitta Haas Incorporated) in undiluted form (a grain size of silica is 60 nm to 80 nm) is used as a slurry; the polishing time is 0.5 minutes; the polishing pressure is 0.001 MPa, the number of spindle rotations on a side where the substrate is fixed is 60 rpm; and the number of rotations of a table where a polishing cloth (polishing pad) is fixed is 56 rpm.

In this embodiment, after the CMP treatment is performed, the plasma treatment is performed using an Ar gas. Then, the planarity of the surface of the base film is measured with an atomic force microscope (AFM). The center line average roughness $Ra_{75}$ obtained by the measurement is 0.12 nm. Note that a measurement region of the AFM is 1 μm×1 μm.

Note that $Ra_{75}$ is obtained by expanding center line average roughness, which is defined by JIS B 0031 and JIS B 0061, into three dimensions so as to be applicable to a curved surface. In addition, $Ra_{75}$ can be expressed as "an average value of the absolute values of deviations from a reference surface to a specific surface".

In the above manufacturing steps, an inductively coupled plasma (ICP) etching apparatus is preferably used in the plasma treatment using an Ar gas. In this embodiment, the plasma treatment is performed for 180 seconds under the following conditions: an electric power of 500 W is applied to a coil-shaped electrode; a bias power of 100 W (RF) is applied to the substrate side; an Ar gas is introduced into the etching apparatus at a flow rate of 100 sccm; the pressure is set to 1.35 Pa; and the substrate temperature is set to −10° C. After the plasma treatment, the thickness of the base film 436 is reduced by approximately 10 nm.

Alternatively, a multi-spiral-coil ICP etching apparatus in which a coil is divided in order to lower the inductance of the coil or a spoke-type ICP etching apparatus in which a comb-like coil is provided in a circular flat plate can be used.

Without limitation to the ICP etching apparatus, another plasma treatment apparatus may be used for the planarization of the base film 436.

Note that when a surface of a base film which is not planarized is measured by AFM for comparison, the center line average roughness $Ra_{75}$ is 0.91 nm. In addition, when a surface of a base film which is subjected to only CMP treatment is measured by AFM, the center line average roughness $Ra_{75}$ is 0.21 nm.

Figure 1B:
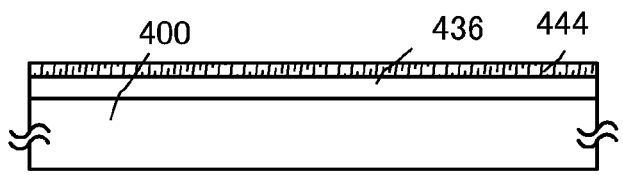

Next, as illustrated in FIG. 1B, an oxide semiconductor film 444 is deposited by a sputtering method, an evaporation method, a PCVD method, a PLD method, an ALD method, an MBE method, or the like.

A material of the oxide semiconductor film 444 preferably contains at least indium (In) or zinc (Zn) and preferably is non-single-crystal. In particular, In and Zn are preferably contained. In addition, as a stabilizer for reducing the variation in electric characteristics of a transistor using the oxide, the oxide semiconductor preferably gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

The oxide semiconductor film is formed preferably by a sputtering method in an oxygen gas atmosphere at a substrate heating temperature of higher than or equal to 100° C. and lower than or equal to 600° C., preferably higher than or equal to 150° C. and lower than or equal to 550° C., and more preferably higher than or equal to 200° C. and lower than or equal to 500° C. The thickness of the oxide semiconductor film is greater than or equal to 1 nm and less than or equal to 40 nm, and preferably greater than or equal to 3 nm and less than or equal to 20 nm. As the substrate heating temperature at the time of deposition is higher, the impurity concentration of the obtained oxide semiconductor film is lower. Further, the atomic arrangement in the oxide semiconductor film is ordered and the density thereof is increased, so that a polycrystal is readily formed. Furthermore, since an oxygen gas atmosphere is employed for the deposition, an unnecessary atom such as a rare gas is not contained, so that a polycrystal is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

In this embodiment, an In—Ga—Zn—O film is formed to a thickness of 10 nm as the oxide semiconductor film 444. An example of the deposition conditions is as follows: the substrate temperature is 300° C.; the pressure is 0.4 Pa; the power is 0.5 kW; and the atmosphere is a mixed atmosphere of oxygen and argon (the flow ratio of oxygen: 30 sccm, and the flow rate of argon is 15 sccm).

After the deposition of the oxide semiconductor film 444, heat treatment is performed. Through the heat treatment, the oxide semiconductor film 444 can be dehydrated or dehydrogenated. The temperature of the heat treatment is higher than or equal to 400° C. and lower than the strain point of the substrate. In this embodiment, after the deposition of the oxide semiconductor film 444, the substrate is kept in the sputtering deposition apparatus without exposure to the air, and the oxide semiconductor film 444 is subjected to heat treatment at 400° C. under a reduced pressure for 30 minutes.

The atmosphere of the heat treatment is not limited to the reduced pressure, and an atmosphere which does not contain water, hydrogen, and the like (the dew point is lower than or equal to −40° C., preferably lower than or equal to −60° C.), for example, an inert atmosphere or an oxidation atmosphere may be employed (see FIG. 1B).

Note that the location where heat treatment is performed is not limited to the deposition chamber. A device for heating an object to be processed by heat conduction or heat radiation from a heating element such as a resistance heating element may be used. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

Figure 1C:
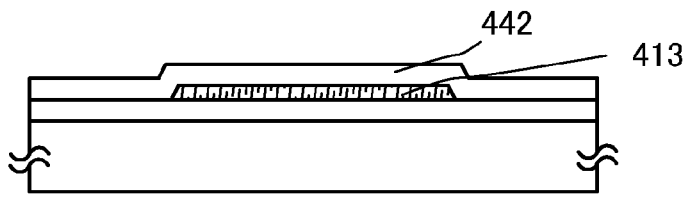

Next, as illustrated in FIG. 1C, the oxide semiconductor film 444 is processed into an island-shaped oxide semiconductor layer 413 through a first photolithography process. For the etching of the oxide semiconductor film 444, wet etching, dry etching, or both of them may be employed.

Next, a gate insulating layer 442 is formed to a thickness greater than or equal to 1 nm and less than or equal to 200 nm (see FIG. 1C). The gate insulating layer 442 can be formed by a sputtering method, an evaporation method, a PCVD method, a PLD method, an ALD method, an MBE method, or the like. In this embodiment, a silicon oxynitride film with a thickness of 30 nm is formed by a PCVD method.

Next, a metal film for forming an electrode functioning as a gate electrode is formed. The metal film can be formed using a metal material such as molybdenum, titanium, tantalum, tungsten, aluminum, copper, chromium, neodymium, or scandium or an alloy material containing any of these materials as its main component. Alternatively, the gate electrode can be formed to have a stacked-layer structure and as one layer thereof, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film may be used. These films each have a work function of 5 eV or higher, preferably 5.5 eV or higher; thus, any of these films used for the gate electrode enables the threshold voltage of the transistor to be positive, so that a so-called normally-off switching element can be provided.

In this embodiment, the metal film has a stacked-layer structure in which a tungsten film with a thickness of 135 nm is formed over a tantalum nitride film with a thickness of 30 nm.

The tantalum nitride film is formed with a sputtering apparatus with a power of 1000 W (DC) in a mixed atmosphere of argon: nitrogen=5:1. Substrate heating is not performed in the film deposition. The tungsten film is formed with a sputtering apparatus with a power of 4000 W (DC) in an argon atmosphere. The substrate heating temperature in the film deposition is set at 200° C.

Figure 1D:
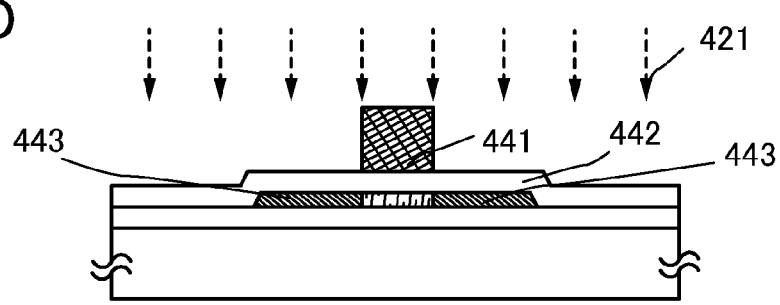

Next, as illustrated in FIG. 1D, the tantalum nitride film and the tungsten film are processed by a second photolithography process, so that a gate electrode 441 is formed.

Next, a dopant 421 is selectively introduced into the island-shaped oxide semiconductor layer 413 through the gate insulating layer 442 using the gate electrode 441 as a mask, whereby low-resistance regions 443 are formed in a self-aligned manner (see FIG. 1D).

The dopant 421 is an impurity which changes the conductivity of the oxide semiconductor film 444. As the dopant 421, one or more of the following can be used: elements belonging to Group 15 (typically, phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

In this embodiment, boron (B) is implanted by an ion implantation method at an accelerating voltage of 10 kV and a dosage of $3 \times 10^{15}$ atoms/cm$^2$.

Then, a gate protective film for covering the gate electrode 441 is formed. The gate protective film can be formed using a silicon oxide film, a gallium oxide film, an aluminum oxide film, a silicon nitride film, a silicon oxynitride film, an aluminum oxynitride film, or a silicon nitride oxide film. As the protective film in this embodiment, a silicon oxynitride film is formed to a thickness of 150 nm by a PCVD method.

Figure 1E:
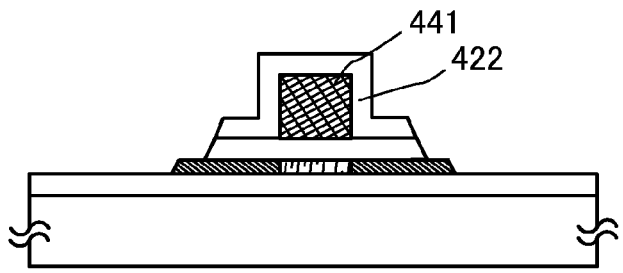

Then, as illustrated in FIG. 1E, the gate protective film and the gate insulating layer are etched by a third photolithography process, so that edge portions of the oxide semiconductor layer 413 are exposed.

Subsequently, a metal film in contact with the edge portions of the oxide semiconductor layer 413 is formed. In this embodiment, a tungsten film with a thickness of 100 nm is formed. The tungsten film is formed using a sputtering apparatus with an electric power of 1000 W (DC) in an argon atmosphere. Note that the substrate heating temperature and the pressure at the deposition are 230° C. and 0.8 Pa, respectively.

Next, the metal film is processed by a fourth photolithography process, so that a source electrode layer 431 and a drain electrode layer 432 are formed.

Then, a first interlayer insulating film 433 and a second interlayer insulating film 434 are formed to cover the gate electrode 441, a gate protective film 422, the source electrode layer 431, and the drain electrode layer 432. As the first interlayer insulating film 433 and the second interlayer insulating film 434, insulating films with good coverage with respect to a step are preferably used. The first interlayer insulating film 433 and the second interlayer insulating film 434 can each be formed using a silicon oxide film, a gallium oxide film, an aluminum oxide film, a silicon nitride film, a silicon oxynitride film, an aluminum oxynitride film, or a silicon nitride oxide film. In this embodiment, an aluminum oxide film with a thickness of 50 nm is deposited by a sputtering method as a first layer (the first interlayer insulating film 433) of the interlayer insulating films and a silicon oxynitride film with a thickness of 300 nm is deposited thereover by a PCVD method as a second layer (the second interlayer insulating film 434) of the interlayer insulating films.

Next, the first interlayer insulating film 433 and the second interlayer insulating film 434 are selectively etched by a fifth photolithography process, whereby a contact hole reaching the source electrode layer 431 and a contact hole reaching the drain electrode layer 432 are formed. Although not illustrated in the figure, a contact hole reaching the gate electrode 441 is also formed.

Next, a titanium film with a thickness of 50 nm, an aluminum film with a thickness of 100 nm, and a titanium film with a thickness of 50 nm are stacked.

Figure 1F:
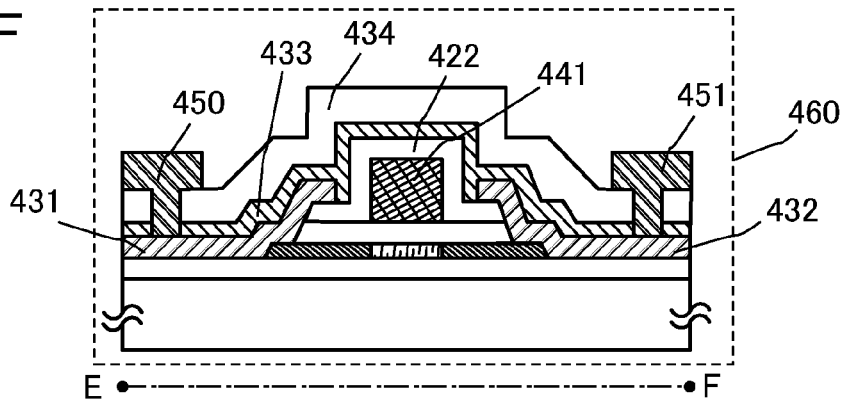

Then, as illustrated in FIG. 1F, the titanium film, the aluminum film, and the titanium film are processed by a sixth photolithography process, whereby a source wiring 450 and a drain wiring 451 are formed.

Through the above steps, a transistor 460 can be manufactured.

Figure 4:
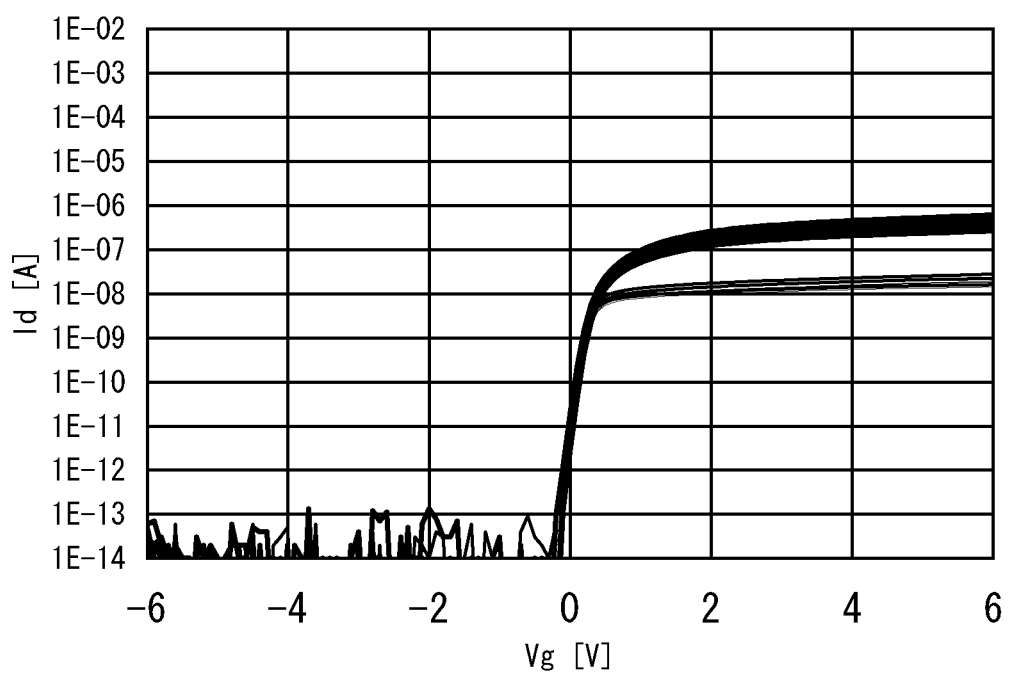
FIG. 4 is a graph showing a Vg-Id curve of a transistor of one embodiment of the present invention.

Electrical characteristics of the manufactured transistor was measured. The results thereof are shown in FIG. 4. FIG. 4 shows data of Vg-Id curves (Vds=1 V, Vds=10 V). The S-value was 86.1 V/dec.

In the case of a transistor as a comparative example which is manufactured without planarization treatment, the S-value was 95.9 mV/dec.

In addition, for comparison, in the case of a transistor which is manufactured by a method in which only CMP treatment is performed as planarization treatment, the S-value was 86.9 mV/dec.

These results show that when a transistor is formed in such a manner that a base film is subjected to CMP treatment and plasma treatment after the CMP treatment, as a planarization treatment to have high planarity and an oxide semiconductor layer is provided on and in contact with the base film, the transistor can have an excellent S-value.

Note that one embodiment of the present invention is not limited to the structure of the transistor 460 described in this embodiment. For example, a transistor 461 illustrated in FIG. 3 may be employed. The transistor 461 is formed in such a manner that a source electrode layer and a drain electrode layer are formed over a base film and then an oxide semiconductor layer is formed. Note that the manufacturing process of the transistor 460 is substantially the same as that of the transistor 461; therefore, repeated description is omitted. In addition, the same portion or portions having the same functions in FIGS. 1A to 1F and FIG. 3 are denoted by the same reference numerals.

Figure 3:
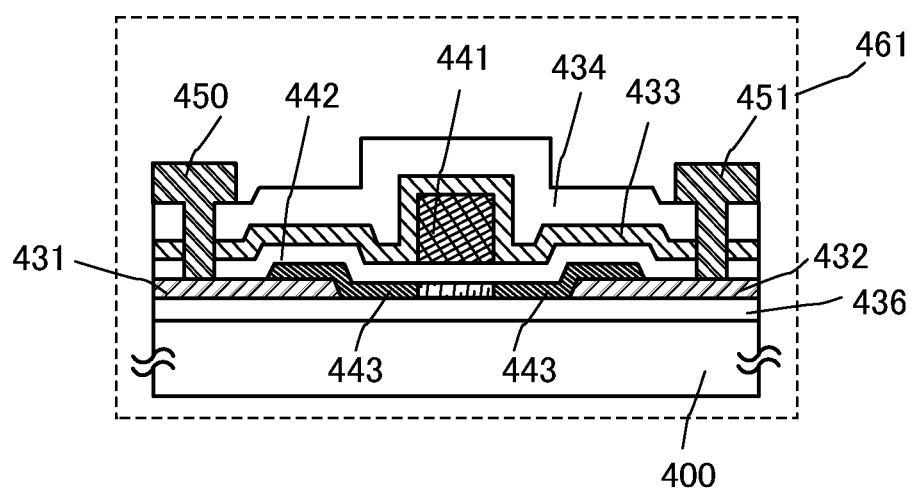
FIG. 3 is a cross-sectional view of a transistor of one embodiment of the present invention.

Alternatively, a transistor having the structure of FIG. 3 which additionally includes a sidewall formed of an insulator on a side surface of the gate electrode may be employed.

Although the transistor 460 described in this embodiment has the structure in which the source electrode layer 431 and the drain electrode layer 432 are in contact with at least part of top surfaces of the pair of low-resistance regions 443, one embodiment of the present invention is not limited to this structure. For example, a structure in which the low-resistance region 443 is in contact with at least part of the source wiring 450 or part of the drain wiring 451 may be employed. In addition, a structure in which the low-resistance regions 443 are not provided in the oxide semiconductor layer 413 may be employed.

Embodiment 2

Figure 5A:
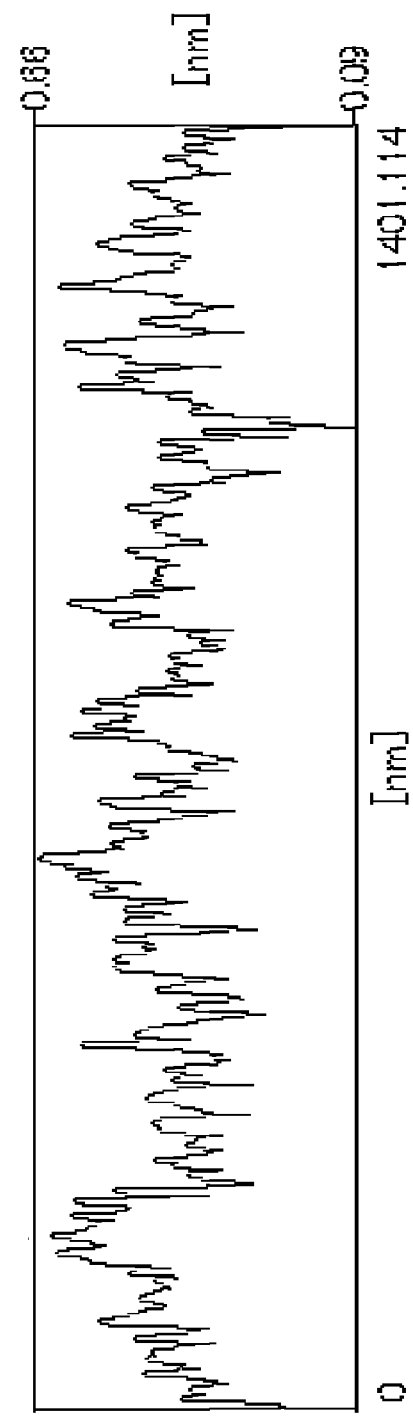
FIGS. 5A and 5B are graphs showing profile curves of a surface of a base film at the center and at an edge of a substrate, which are obtained with AFM.
Figure 5B:
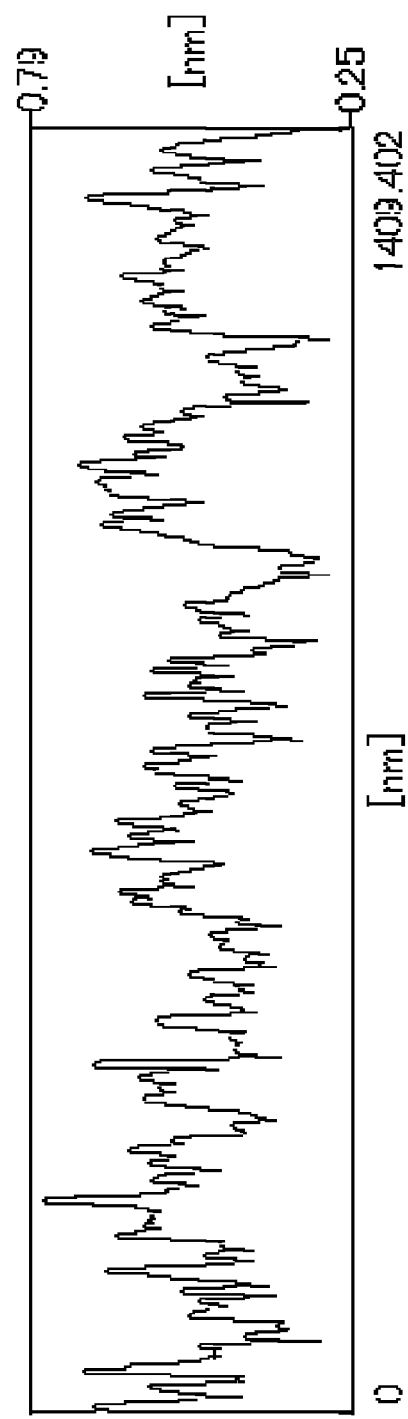
Figure 6A:
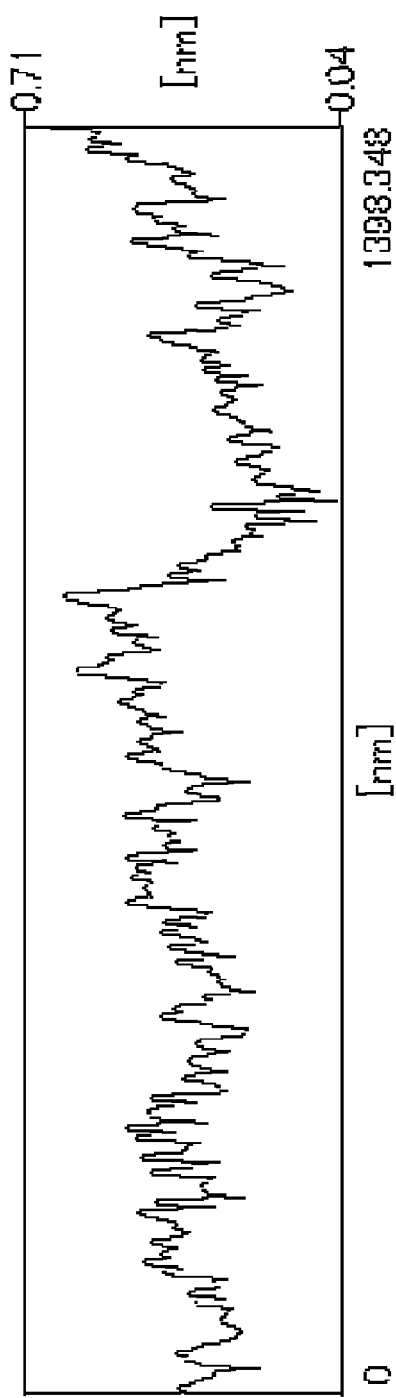
FIGS. 6A and 6B are graphs showing profile curves of a surface of a base film at the center and at an edge of a substrate, which are obtained with AFM.
Figure 6B:
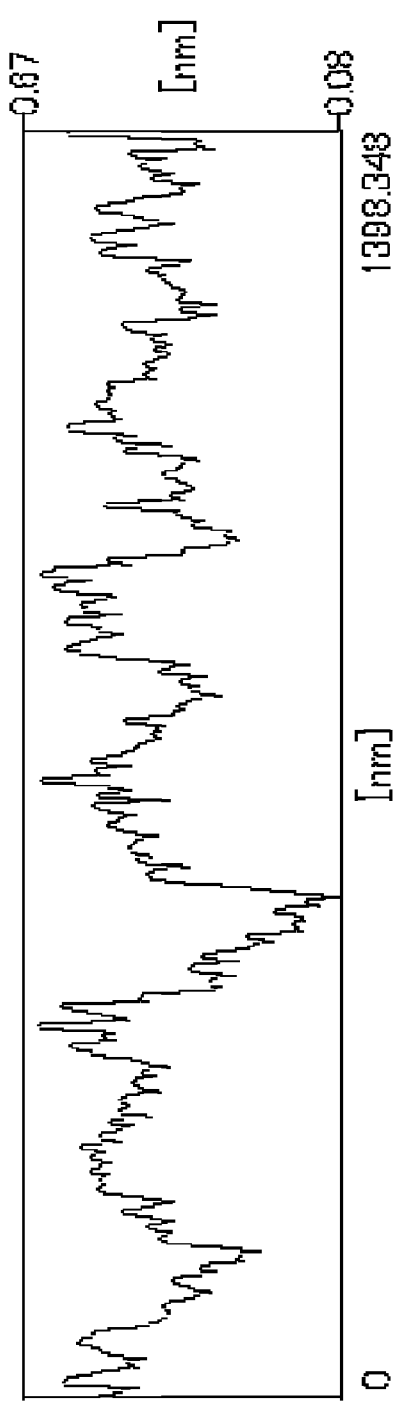

In this embodiment, a sample of a base film having excellent planarity is obtained by performing planarization treatment under conditions which are the same as those in Embodiment 1. The sample is measured and the obtained planarization data is shown in FIGS. 5A and 5B. FIG. 5A shows a profile curve of a portion at the center of a substrate, and FIG. 5B shows a profile curve of a portion at an edge of the substrate. In order to check repeatability, another sample is manufactured and measured, and the result is shown in FIGS. 6A and 6B. As shown in FIGS. 6A and 6B, both the samples have substantially the same planarity. FIG. 5A and FIG. 6A each show a profile curve of the portion at the center of the substrate, and FIG. 5B and FIG. 6B each show a profile curve of the portion at the edge of the substrate.

The center line average roughness $Ra_{75}$ obtained by AFM is 0.07283 nm at the center of the substrate, and is 0.08241 nm at the edge of the substrate.

Measurement values obtained by AFM except the center line average roughness $Ra_{75}$ are described below. Note that the measurement area of AFM is 1 μm×1 μm.

In the case of the data of the portion at the center of the substrate shown in FIG. 5A, the maximum peak-to-valley height (P-V) is 0.988 nm, the maximum peak height (Rp) is 0.6115 nm, the maximum valley depth (Rv) is −0.3765 nm, the root-mean-square surface roughness (RMS) is 0.09209 nm, and the n-point average roughness (Rz) is 0.7193 nm.

In the case of the data at the edge of the substrate shown in FIG. 5B, the maximum peak-to-valley height (P-V) is 0.8111 nm, the maximum peak height (Rp) is 0.4055 nm, the maximum valley depth (Rv) is −0.4055 nm, the root-mean-square surface roughness (RMS) is 0.1032 nm, and the n-point average roughness (Rz) is 0.6758 nm.

In addition, the center line average roughness $Ra_{75}$ of the sample which is obtained to see repeatability is 0.07935 nm at the center of the substrate and 0.08745 nm at the edge of the substrate.

This embodiment can be freely combined with Embodiment 1.

Although the center line average roughness $Ra_{75}$ of the sample described in Embodiment 1 is 0.12 nm, the center line average roughness $Ra_{75}$ of the sample described in this embodiment is 0.07283 nm at the center of the substrate and 0.08241 nm at the edge of the substrate. Therefore, needless to say, when a transistor is formed using the base film of this sample described in this embodiment, an S-value which is superior to the S-value described in Embodiment 1 can be expected.

Embodiment 3

In this embodiment, when planarization treatment which is different from that described in Embodiment 1 is performed, the proportion of a portion whose center line average roughness $Ra_{75}$ is less than or equal to 0.1 nm to the entire surface of a base film can be increased.

Plasma treatment is performed before the CMP treatment described in Embodiment 1, whereby the center line average roughness $Ra_{75}$ can be approximately 0.08 nm.

In other words, after first plasma treatment is performed, CMP treatment is performed, and then second plasma treatment is performed, whereby the proportion of the portion whose center line average roughness $Ra_{75}$ is less than or equal to 0.1 nm to the entire surface of the base film can be surely increased.

The first plasma treatment in this embodiment is performed under the same conditions as those of the plasma treatment described in Embodiment 1.

This embodiment can be freely combined with Embodiment 1.

Embodiment 4

Figure 7A:
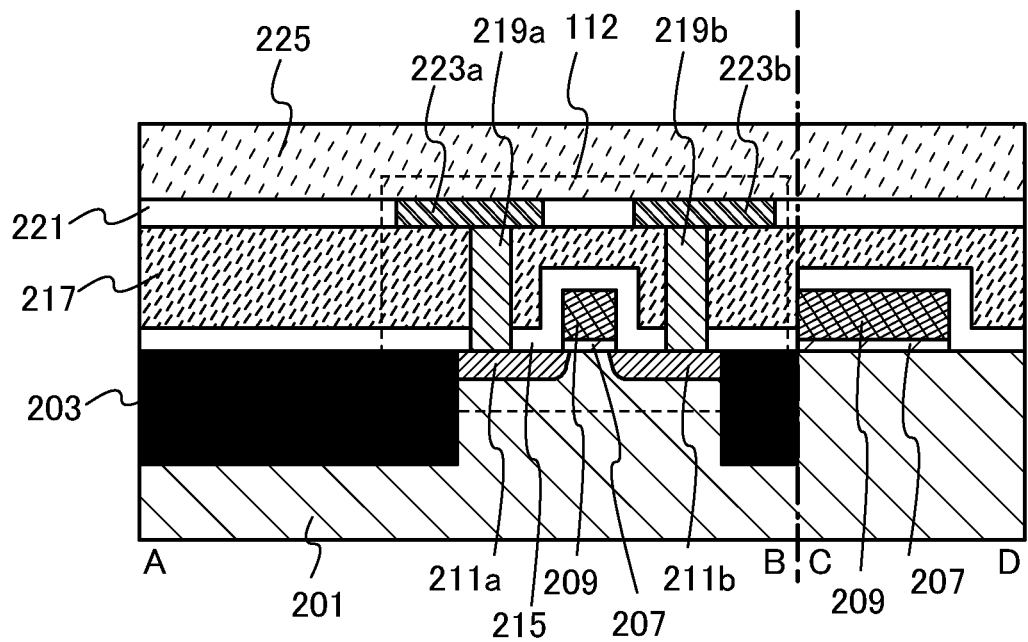
FIGS. 7A and 7B are cross-sectional views illustrating manufacturing steps of a semiconductor device.

In this embodiment, an example of manufacturing a semiconductor device by stacking different transistors will be described with reference to FIGS. 7A and 7B. In this embodiment, a transistor whose semiconductor layer includes silicon is formed and planarized, and then a transistor whose semiconductor layer is an oxide semiconductor layer is stacked thereover. A detailed manufacturing method will be described below.

First, element isolation regions 203 are formed in a p-type semiconductor substrate 201.

Examples of the p-type semiconductor substrate 201 are a single crystal silicon substrate (a silicon wafer) having p-type conductivity and a compound semiconductor substrate (e.g., a SiC substrate, a sapphire substrate, and a GaN substrate).

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation regions 203 are formed by a local oxidation of silicon (LOCOS) method, a shallow trench isolation (STI) method, or the like.

When a p-channel transistor is formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Next, a gate insulating film 207 and a gate electrode 209 are formed over the semiconductor substrate 201.

A surface of the semiconductor substrate 201 is oxidized by performing heat treatment, so that a silicon oxide film is formed. Alternatively, a stack of a silicon oxide film and a silicon film containing oxygen and nitrogen (silicon oxynitride film) may be formed in such a manner that the silicon oxide film is formed by thermal oxidation and then nitridation treatment is performed to nitride a surface of the silicon oxide film. Next, part of the silicon oxide film or part of the silicon oxynitride film is selectively etched, thereby forming the gate insulating film 207. Alternatively, a silicon oxide, a silicon oxynitride, or a high dielectric constant substance (also referred to as a high-k material) including a metal oxide such as a tantalum oxide, a hafnium oxide, a hafnium silicate oxide, a zirconium oxide, an aluminum oxide, or a titanium oxide or a rare-earth oxide such as a lanthanum oxide, or the like is formed to have a thickness of 5 nm to 50 nm by a CVD method, a sputtering method, or the like, and then is partly etched selectively, so that the gate insulating film 207 is formed.

The gate electrode 209 is preferably formed using a metal such as tantalum, tungsten, titanium, molybdenum, chromium, or niobium or an alloy material or a compound material containing any of the metals as its main component. Further, polycrystalline silicon to which an impurity element such as phosphorus is added can be used. Alternatively, the gate electrode 209 may be a stack of a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209 is formed in such a manner that a conductive film is formed by a sputtering method, a CVD method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the gate insulating film 207 and the gate electrode 209 are formed.

Note that in terms of higher integration, it is preferable that a sidewall insulating layer be not provided on a side surface of the gate electrode 209. On the other hand, a sidewall insulating layer can be provided on a side surface of the gate electrode 209 if a priority is given to characteristics of a transistor.

Next, an impurity element imparting n-type conductivity is added to the semiconductor substrate 201 to form n-type impurity regions 211a and 211b. In the case where an n-well region is formed in the semiconductor substrate 201, an impurity element imparting p-type conductivity is added to the n-well region to form p-type impurity regions. The concentration of the impurity element imparting n-type conductivity in the n-type impurity regions 211a and 211b and the concentration of the impurity element imparting p-type conductivity in the p-type impurity regions are higher than or equal to $1 \times 10^{19}/cm^3$ and lower than or equal to $1 \times 10^{21}/cm^3$. The impurity element imparting n-type conductivity and the impurity element imparting p-type conductivity are added to the semiconductor substrate 201 and the n-well region, respectively, by ion doping, ion implantation, or the like as appropriate.

In the case where a sidewall insulating layer is provided on a side surface of the gate electrode 209, an impurity region having an impurity concentration different from those of the n-type impurity regions 211a and 211b and the p-type impurity regions can be formed in a region overlapping with the sidewall insulating layer.

Next, an insulating film 215 and an insulating film 217 are formed over the semiconductor substrate 201, the element isolation regions 203, the gate insulating film 207, and the gate electrode 209 by a sputtering method, a CVD method, or the like.

The insulating films 215 and 217 are each formed with a single layer or a stack of layers using one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 is increased. When such an insulating film 215 is used and heat treatment is performed, the semiconductor substrate is hydrogenated and dangling bonds are terminated with hydrogen, so that defects in the semiconductor substrate can be reduced.

The planarity of the insulating film 217 can be high when the insulating film 217 is formed using an inorganic material such as boron phosphorus silicon glass (BPSG) or an organic material such as polyimide or acrylic.

After the insulating film 215 or the insulating film 217 is formed, heat treatment is performed in order to activate the impurity elements added to the n-type impurity regions 211a and 211b and the p-type impurity regions.

Through the above-described steps, the n-channel transistor 112 can be manufactured.

Next, part of the insulating film 215 and part of the insulating film 217 are selectively etched to form openings. Then, a contact plug 219a and a contact plug 219b are formed in the openings. Typically, the contact plugs 219a to 219d are formed in such a manner that after a conductive film is formed by a sputtering method, a CVD method, or the like, planarization treatment is performed by a CMP method, etching, or the like so that an unnecessary portion of the conductive film is removed.

The conductive film serving as the contact plugs 219a and 219b is formed by depositing tungsten silicide in the openings by a CVD method using a $WF_6$ gas and a $SiH_4$ gas.

Next, an insulating film is formed over the insulating film 217 and the contact plugs 219a and 219b by a sputtering method, a CVD method, or the like, and after that, part of the insulating film is selectively etched to form an insulating film 221 having a groove. Subsequently, a conductive film is formed by a sputtering method, a CVD method, or the like and then subjected to planarization treatment such as a CMP method or etching so that an unnecessary portion of a surface of the conductive film is removed, thereby forming wirings 223a and 223b.

Here, the wirings 223a and 223b function as source and drain electrodes of the transistor 112.

The insulating film 221 can be formed using a material similar to that for the insulating film 215.

The wirings 223a and 223b are formed with a single layer or a stack of layers containing a metal such as aluminum, titanium, chromium, nickel, copper, yttrium, zirconium, molybdenum, silver, tantalum, or tungsten or an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

When the insulating film 221 and the wirings 223a and 223b which are planarized are used, the planarity of a base film formed later is improved, and variations in electric characteristics of the transistor including an oxide semiconductor, which is formed later, can be reduced. Further, the transistor including an oxide semiconductor layer can be formed in high yield.

Then, hydrogen contained in the insulating film 221 and the wirings 223a and 223b is preferably eliminated by heat treatment or plasma treatment. Consequently, in heat treatment performed later, diffusion of hydrogen into an insulating film and an oxide semiconductor film which are formed later can be prevented. The heat treatment is performed at a temperature higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Then, an insulating film 225 to be the base film of the transistor including an oxide semiconductor layer is formed over the insulating film 221 and the wirings 223a and 223b by a sputtering method, a CVD method, or the like. The insulating film 225 is formed with a single layer or a stack of layers containing silicon oxide, silicon oxynitride, silicon nitride oxide, gallium oxide, hafnium oxide, yttrium oxide, aluminum oxide, and/or aluminum oxynitride. Further, the insulating film 225 is preferably formed using an oxide insulating film from which part of oxygen is released by heating. The oxide insulating film from which part of oxygen is released by heating is preferably an oxide insulating film which contains oxygen at a proportion exceeding the stoichiometric proportion. Since oxygen is released from such an oxide insulating film by heating, oxygen can be diffused into the oxide semiconductor film by heat treatment performed later.

Next, the insulating film 225 is subjected to planarization treatment. After the method described in Embodiment 1, i.e., CMP treatment is performed, plasma treatment is performed with an ICP etching apparatus (see FIG. 7A). This planarization enables the surface of the insulating film 225 to have a center line average roughness $Ra_{75}$ of 0.1 nm or less.

Next, an oxide semiconductor film is formed over the insulating film 225 having a surface whose center line average roughness $Ra_{75}$ is less than or equal to 0.1 nm by a sputtering method, a coating method, a printing method, an evaporation method, a PCVD method, a PLD method, an ALD method, an MBE method, or the like. Subsequent steps are performed in accordance with Embodiment 1 to form a transistor 460.

In this embodiment, an oxide semiconductor layer including CAAC (c-axis aligned crystal) is used as the oxide semiconductor layer of the transistor 460. The oxide semiconductor layer including CAAC is a thin film which is non-signal-crystal and crystallized along to the c-axes but alignment along the a-b planes does not necessarily appear. The oxide semiconductor layer including CAAC is a thin film having a novel structure including a grain boundary.

When such an oxide semiconductor film including a crystal having c-axis alignment is provided, changes in the electrical characteristics of the transistor due to irradiation with visible light or ultraviolet light can be suppressed. In particular, it is effective that the center line average roughness $Ra_{75}$ of the surface of the insulating film 225 is less than or equal to 0.1 nm as described above. Thus, not only the S-value but also the crystallinity of the oxide semiconductor film including the crystals whose c-axes are aligned can be increased, and the mobility of the transistor including the oxide semiconductor film can also be increased.

Figure 7B:
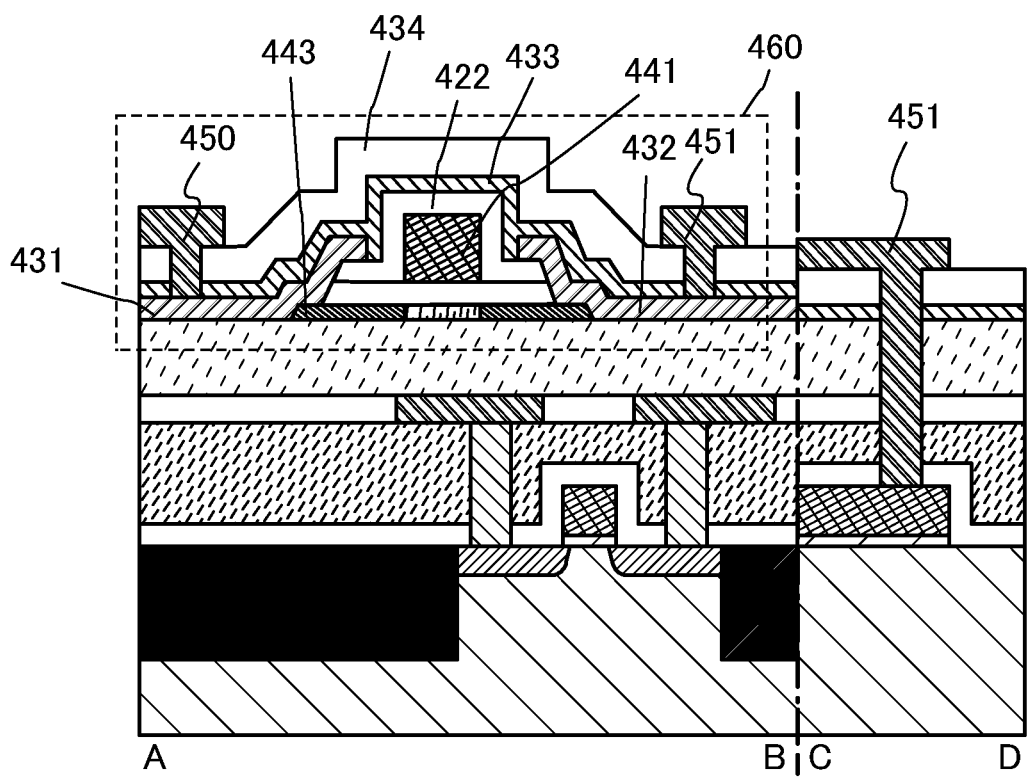

Through the above steps, the transistor 460 including an oxide semiconductor can be manufactured as illustrated in FIG. 7B. Note that the transistor 460 includes the oxide semiconductor layer which is i-type (intrinsic) or substantially i-type, and therefore has exceptional characteristics.

In FIG. 7B, the one of a source electrode layer 431 and a drain electrode layer 432 of the transistor 460 and the gate electrode 209 of the transistor 112 are connected through a source wiring 450; however, this embodiment is not limited to this structure. For example, a top surface of the gate electrode of the transistor 112 may be exposed from a top surface of the insulating film provided over the transistor 112, and one of the source electrode layer and the drain electrode layer of the transistor 460 may be provided in direct contact with the top surface of the gate electrode.

Through the above steps, the transistor 460 can be manufactured over the n-channel transistor 112.

A memory element (hereinafter also referred to as a memory cell) can be formed using a combination of the n-channel transistor 112 and the transistor 460. Further, a central processing unit (CPU) can be formed with use of the transistor 460 for at least part of the CPU. In addition, the transistor 460 can also be applied to an LSI such as a digital signal processor (DSP), a custom LSI, or a field programmable gate array (FPGA).

Embodiment 5

In this embodiment, an example in which at least part of a driver circuit and a transistor to be disposed in a pixel portion are formed over one substrate in a display device will be described.

The transistor in the pixel portion is formed in accordance with Embodiment 1. Further, the transistor 460 described in Embodiment 1 is an n-channel transistor, and thus a part of a driver circuit that can be formed of n-channel transistors in the driver circuits is formed over the same substrate as the transistor of the pixel portion.

Figure 8A:
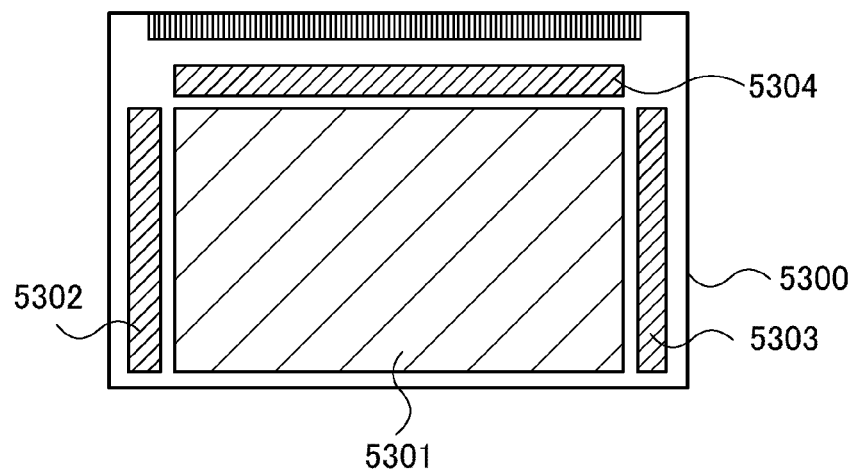
FIGS. 8A to 8C are a block diagram and equivalent circuit diagrams illustrating one embodiment of the present invention.

FIG. 8A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection point such as a flexible printed circuit (FPC).

In FIG. 8A, the first scan line driver circuit 5302, the second scan line driver circuit 5303, and the signal line driver circuit 5304 are formed over the substrate 5300 where the pixel portion 5301 is formed. Accordingly, the number of components of a drive circuit which is provided outside and the like are reduced, so that reduction in cost can be achieved. Further, if the driver circuit is provided outside the substrate 5300, wiring would need to be extended and the number of wiring connections would be increased, but if the driver circuit is provided over the substrate 5300, the number of wiring connections can be reduced. Consequently, improvement in reliability and yield can be achieved.

Figure 8B:
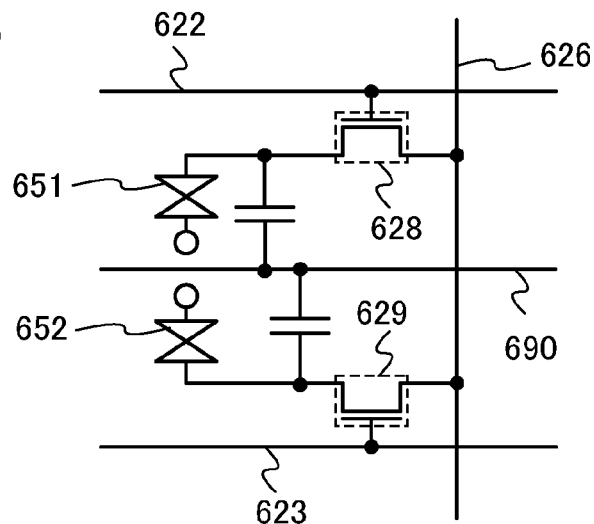

FIG. 8B illustrates one example of a circuit configuration of the pixel portion. Here, a pixel configuration of a VA liquid crystal display panel is employed.

In this pixel configuration, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

A gate wiring 622 of a transistor 628 and a gate wiring 623 of a transistor 629 are separated so that different gate signals can be given thereto. In contrast, a source or drain electrode layer 626 functioning as a data line is shared by the transistors 628 and 629. As each of the transistor 628 and the transistor 629, the transistor 460 described in Embodiment 1 can be used as appropriate.

A first pixel electrode layer and a second pixel electrode layer have different shapes and are separated by a slit. The second pixel electrode layer is provided so as to surround the external side of the first pixel electrode layer which is spread in a V shape. The timing of voltage application is made to vary between the first and second pixel electrode layers by the transistors 628 and 629 in order to control alignment of the liquid crystal. The transistor 628 is connected to the gate wiring 622, and the transistor 629 is connected to the gate wiring 623. When different gate signals are supplied to the gate wiring 622 and the gate wiring 623, operation timings of the transistor 628 and the transistor 629 can be varied.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, a liquid crystal layer, and a counter electrode layer overlap with each other to form a second liquid crystal element 652. The pixel configuration is a multi-domain structure in which the first liquid crystal element 651 and the second liquid crystal element 652 are provided in one pixel.

Note that the pixel configuration is not limited to that illustrated in FIG. 8B. For example, a switch, a resistor, a capacitor, a transistor, a sensor, or a logic circuit may be added to the pixel illustrated in FIG. 8B.

In this embodiment, an example of the VA liquid crystal display panel is described; however, there is no particularly limitation, and the present invention can be applied to various modes of liquid crystal display devices. For example, as a method for improving viewing angle characteristics, one embodiment of the present invention can be applied to a lateral electric field mode (also referred to as an IPS mode) in which an electric field in the horizontal direction to the main surface of a substrate is applied to a liquid crystal layer.

For example, it is preferable to use liquid crystal exhibiting a blue phase for which an alignment film is not necessary for an IPS liquid crystal display panel. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed at 5 wt. % or more is used for a liquid crystal layer of a liquid crystal element in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence.

Further, in order to improve moving-image characteristics of a liquid crystal display device, a driving technique (e.g., a field sequential method) may be employed, in which a plurality of light-emitting diodes (LEDs) or a plurality of EL light sources is used as a backlight to form a surface light source, and each light source of the surface light source is independently driven in a pulsed manner in one frame period. As the surface light source, three or more kinds of LEDs may be used and an LED emitting white light may be used. In the case where three or more kinds of light sources emitting different colors (e.g., light sources of red (R), green (G), and blue (B)) are used as the surface light source, color display can be performed without a color filter. Further, in the case where an LED emitting white light is used as the surface light source, color display is performed with a color filter. Since a plurality of LEDs can be controlled independently, the light emission timing of LEDs can be synchronized with the timing at which a liquid crystal layer is optically modulated. By this driving technique, the LEDs can be partly turned off; therefore, particularly in the case of displaying a picture including a black display region in most of a screen, consumed power can be reduced.

Figure 8C:
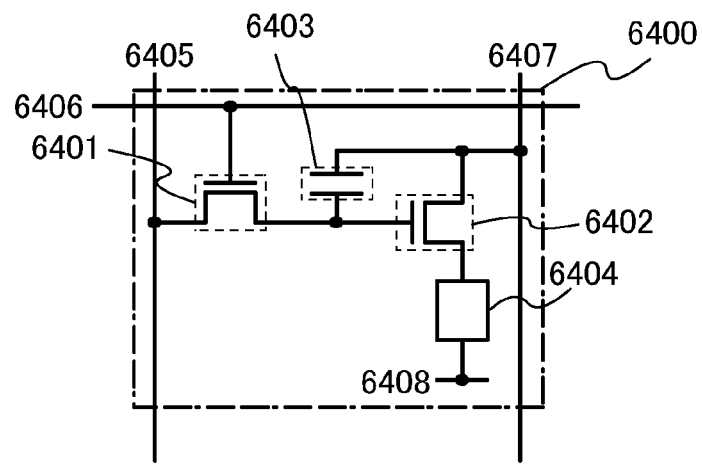

FIG. 8C illustrates one example of a circuit configuration of the pixel portion. Here, a pixel configuration of a display panel using an organic EL element is employed.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 8C illustrates one example of a pixel configuration to which digital time grayscale driving can be applied, as an example of a semiconductor device.

A configuration and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate electrode of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode of the driver transistor 6402. The gate electrode of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitance of the driving transistor 6402 may be formed between the channel formation region and the gate electrode.

In the case of a voltage-input voltage driving method, a video signal is input to the gate electrode of the driver transistor 6402 so that the driver transistor 6402 is either substantially turned on or substantially turned off. That is, the driver transistor 6402 operates in a linear region. That is, the driving transistor 6402 operates in a linear region, and thus, voltage higher than the voltage of the power supply line 6407 is applied to the gate electrode of the driving transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel configuration as FIG. 8C can be used by changing signal input.

In the case of performing analog grayscale driving, a voltage greater than or equal to the sum of the forward voltage of the light-emitting element 6404 and Vth of the driving transistor 6402 is applied to the gate electrode of the driving transistor 6402. The forward voltage of the light-emitting element 6404 indicates a voltage at which a desired luminance is obtained, and includes at least forward threshold voltage. The video signal by which the driver transistor 6402 operates in a saturation region is input, whereby current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel configuration is not limited to that illustrated in FIG. 8C. For example, a switch, a resistor, a capacitor, a sensor, a transistor, or a logic circuit may be added to the pixel illustrated in FIG. 8C.

Embodiment 6

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone (also referred to as a cellular phone or a mobile phone device), a portable game machine, a portable information terminal, an audio reproducing device, a large-sized game machine such as a pachinko machine, and the like. Examples of electronic appliances each including the transistor 460 described in Embodiment 1 are described.

Figure 9A:
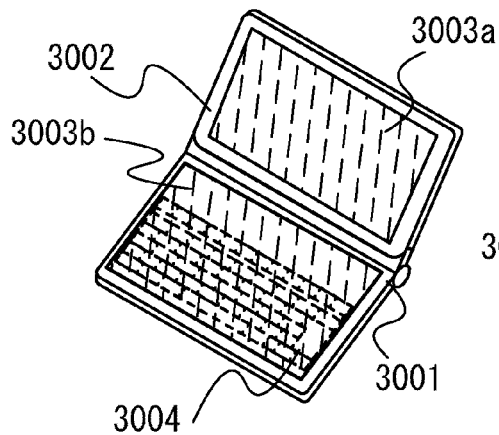
FIGS. 9A to 9D illustrate embodiments of an electronic appliance.

FIG. 9A illustrates a portable information terminal which includes s main body 3001, a housing 3002, display portions 3003a and 3003b, and the like. The portable information terminal includes at least a battery, and preferably includes a memory for storing data (e.g., a flash memory circuit, an SRAM circuit, or a DRAM circuit), a central processing unit (CPU), or a logic circuit. The transistor 460 described in Embodiment 1 may be used for the CPU to reduce power consumption. In the case of the transistor 460 described in Embodiment 1, the S-value is favorable and on/off switching can be performed at a low voltage. Therefore, a circuit including the transistor 460 can operate at a low voltage.

The display portion 3003b functions as a touch panel. By touching a keyboard 3004 displayed on the display portion 3003b, a screen can be operated, and text can be input. Needless to say, the display portion 3003a may function as a touch panel. The liquid crystal panel or an organic light-emitting panel is manufactured by using the transistor 460 described in Embodiment 1 as a switching element and applied to the display portions 3003a and 3003b, whereby a portable information terminal can be obtained.

The portable information terminal in FIG. 9A can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

In addition, the portable information terminal illustrated in FIG. 9A may transmit and receive data wirelessly. Through wireless communication, desired book data or the like can be purchased and downloaded from an electronic book server.

Figure 9B:
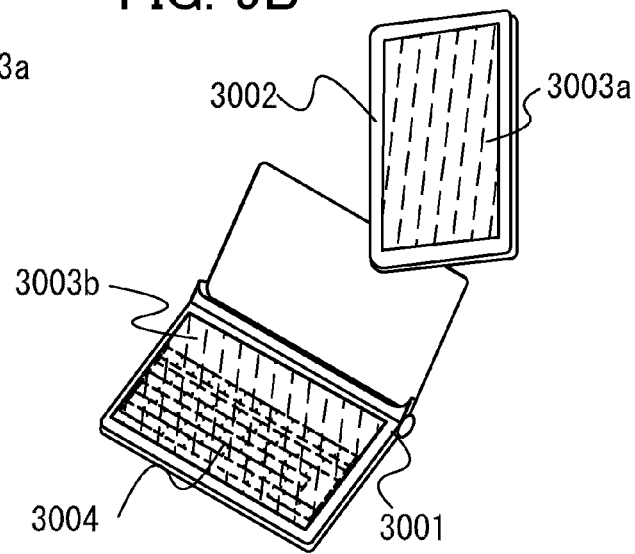

Further, one of the two display portions 3003a and 3003b of the portable information terminal illustrated in FIG. 9A can be detached, for example, as shown in FIG. 9B. The display portion 3003a can be equipped with a function as a touch panel, which contributes to a further reduction in weight when carried around and to the convenience since operation can be performed by one hand while supporting the housing 3002 by the other hand.

Further, the housing 3002 illustrated in FIG. 9B may be equipped with an antenna, a microphone function, or a wireless communication function to be used as a mobile phone.

Figure 9C:
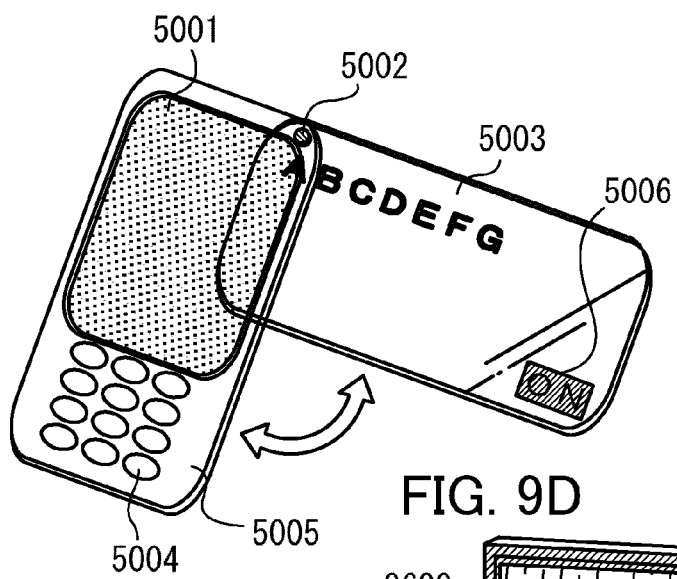

FIG. 9C illustrates an example of a mobile phone. A mobile phone 5005 illustrated in FIG. 9C is provided with a display portion 5001 incorporated in a housing, a display panel 5003 attached to a hinge 5002, operation buttons 5004, a speaker, a microphone, and the like.

In the mobile phone 5005 illustrated in FIG. 9C, the display panel 5003 is slid to overlap the display portion 5001, and the display panel 5003 also functions as a cover having a light-transmitting property. The display panel 5003 is a display panel including a light-emitting element having a dual emission structure, in which light emission is extracted through a surface opposite to the substrate side and the surface on the substrate side.

Since the light-emitting element having a dual emission structure is used for the display panel 5003, display can also be performed with the display portion 5001 overlapped; therefore, both the display portion 5001 and the display panel 5003 can perform display and a user can view both the displays. The display panel 5003 has a light-transmitting property and the view beyond the display panel can be seen. For example, when a map is displayed on the display portion 5001 and the location point of the user is displayed using the display panel 5003, the present location can be recognized easily.

Further, in the case where the mobile phone 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, the user can make conversation while viewing the faces of two or more persons.

When a touch input button 5006 displayed on the display panel 5003 is touched with a finger or the like, data can be input into the mobile phone 5005. In addition, operations such as making calls and composing mails can be conducted by sliding the display panel 5003 and touching the operation buttons 5004 with a finger or the like.

Figure 9D:
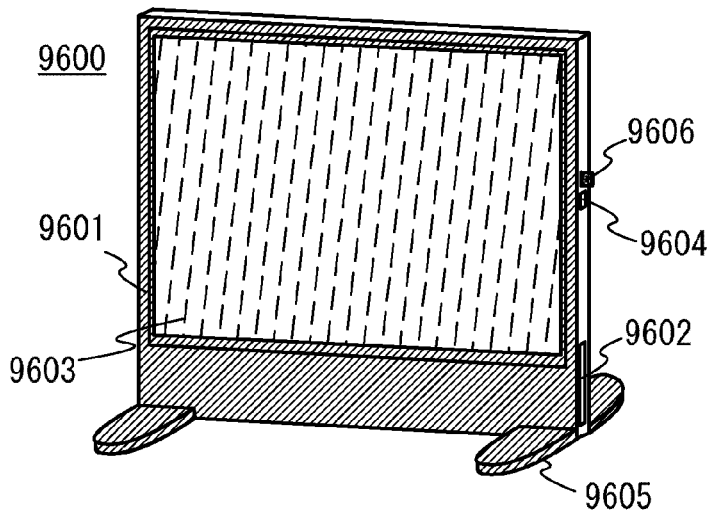

FIG. 9D illustrates an example of a television set. In a television set 9600, a display portion 9603 is incorporated in a housing 9601. The display portion 9603 can display images. Here, the housing 9601 is supported on a stand 9605 provided with a CPU. When the transistor 460 described in Embodiment 1 is applied to the display portion 9603, the CPU, and the like, the television set 9600 can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

The methods and structures described in this embodiment can be combined as appropriate with any of the methods and structures described in the other embodiments.

This application is based on Japanese Patent Application serial no. 2011-152001 filed with Japan Patent Office on Jul. 8, 2011, the entire contents of which are hereby incorporated by reference.

What is claimed is:

1. A method for manufacturing a semiconductor device, comprising the steps of:
    forming a base film over a substrate;
    performing chemical mechanical polishing treatment on the base film;
    performing plasma treatment on the base film after the chemical mechanical polishing treatment; and
    forming an oxide semiconductor layer over a planar surface which is obtained by the plasma treatment and the chemical mechanical polishing treatment.

2. The method for manufacturing a semiconductor device according to claim 1, wherein the plasma treatment is plasma treatment using a rare gas.

3. The method for manufacturing a semiconductor device according to claim 1, wherein the substrate is a semiconductor substrate.

4. The method for manufacturing a semiconductor device according to claim 1, wherein the substrate is a glass substrate.

5. The method for manufacturing a semiconductor device according to claim 1, wherein the plasma treatment is performed with an inductively coupled plasma etching apparatus.

6. The method for manufacturing a semiconductor device according to claim 1, wherein the oxide semiconductor layer comprises In—Ga—Zn—O-based oxide semiconductor.

7. The method for manufacturing a semiconductor device according to claim 1, wherein the oxide semiconductor layer includes a crystal having a c-axis alignment.

8. The method for manufacturing a semiconductor device according to claim 1, wherein the center line average roughness $Ra_{75}$ of the surface of the base film is less than or equal to 0.1 nm.

9. A method for manufacturing a semiconductor device, comprising the steps of:
    forming a base film over a substrate;
    performing first plasma treatment on the base film;
    performing chemical mechanical polishing treatment on the base film after the first plasma treatment;
    performing second plasma treatment on the base film after the chemical mechanical polishing treatment; and
    forming an oxide semiconductor layer over a planar surface which is obtained by the first plasma treatment, the chemical mechanical polishing treatment, and the second plasma treatment.

10. The method for manufacturing a semiconductor device according to claim 9, wherein the first plasma treatment and the second plasma treatment are each plasma treatment using a rare gas.

11. The method for manufacturing a semiconductor device according to claim 9, wherein the base film is any of a silicon oxide film, a gallium oxide film, a hafnium oxide film, and an aluminum oxide film.

12. The method for manufacturing a semiconductor device according to claim 9, wherein the substrate is a semiconductor substrate.

13. The method for manufacturing a semiconductor device according to claim 9, wherein the substrate is a glass substrate.

14. The method for manufacturing a semiconductor device according to claim 9, wherein the plasma treatment is performed with an inductively coupled plasma etching apparatus.

15. The method for manufacturing a semiconductor device according to claim 9, wherein the oxide semiconductor layer comprises In—Ga—Zn—O-based oxide semiconductor.

16. The method for manufacturing a semiconductor device according to claim 9, wherein the oxide semiconductor layer includes a crystal having a c-axis alignment.

17. The method for manufacturing a semiconductor device according to claim 9, wherein the center line average roughness $Ra_{75}$ of the surface of the base film is less than or equal to 0.1 nm.

* * * * *